(12) United States Patent
Downes

(10) Patent No.: US 6,716,072 B1
(45) Date of Patent: Apr. 6, 2004

(54) SYSTEMS AND METHODS FOR DISPOSING A CIRCUIT BOARD COMPONENT ON A CIRCUIT BOARD USING A SOLDERING PIN

(75) Inventor: Stuart D. Downes, Milford, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 10/184,495

(22) Filed: Jun. 27, 2002

(51) Int. Cl.[7] .................................................. H01R 4/48
(52) U.S. Cl. ........................................................ 439/876
(58) Field of Search ..................... 439/83, 876; 174/267

(56) References Cited

U.S. PATENT DOCUMENTS

| | | | |
|---|---|---|---|
| 4,076,356 A | | 2/1978 | Tamburro ..................... 339/17 |
| 4,246,627 A | * | 1/1981 | Poensgen ..................... 361/773 |
| 4,521,827 A | * | 6/1985 | Jordan et al. ................ 361/704 |
| 4,895,522 A | * | 1/1990 | Grabbe et al. ................ 439/63 |
| 4,968,263 A | | 11/1990 | Silbernagel et al. ......... 439/246 |
| 5,029,748 A | * | 7/1991 | Lauterbach et al. ..... 228/180.1 |
| 5,548,486 A | | 8/1996 | Kman et al. ................ 361/791 |
| 5,565,654 A | | 10/1996 | Zell et al. ................... 174/265 |
| 5,656,798 A | * | 8/1997 | Kubo et al. .................. 174/265 |
| 5,816,868 A | | 10/1998 | Legrady et al. ............. 439/876 |
| 6,049,039 A | | 4/2000 | Fushimi ..................... 174/68.1 |
| 6,179,631 B1 | | 1/2001 | Downes et al. ................ 439/83 |
| 6,217,346 B1 | | 4/2001 | Cubon .......................... 439/78 |
| 6,229,101 B1 | | 5/2001 | Sekiya et al. ............... 174/266 |
| 6,283,765 B1 | * | 9/2001 | Lumbis et al. ................ 439/35 |

FOREIGN PATENT DOCUMENTS

| | | |
|---|---|---|
| DE | 27 35 746 A1 * | 2/1979 |
| JP | 363285961 A | 11/1988 |
| JP | 4710074884 A | 3/1998 |

* cited by examiner

Primary Examiner—Tulsidas Patel
Assistant Examiner—Phuong Dinh
(74) Attorney, Agent, or Firm—Chapin & Huang, L.L.C.; David E. Huang, Esq.

(57) ABSTRACT

A pin solders to a circuit board. The pin includes a soldering portion which is configured to solder to a via of the circuit board and an engagement portion which is configured to engage with a circuit board component. The soldering portion has a circular cross-section and a soldering portion diameter. Similarly, the engagement portion has a circular cross-section and an engagement portion diameter. The soldering portion diameter is substantially narrower than the engagement portion diameter. Accordingly, the soldering portion can solder to relatively narrow circuit board via having a small anti-pad, and the thicker engagement portion can provide suitable strength for positioning the circuit board component in a reliable manner.

32 Claims, 13 Drawing Sheets

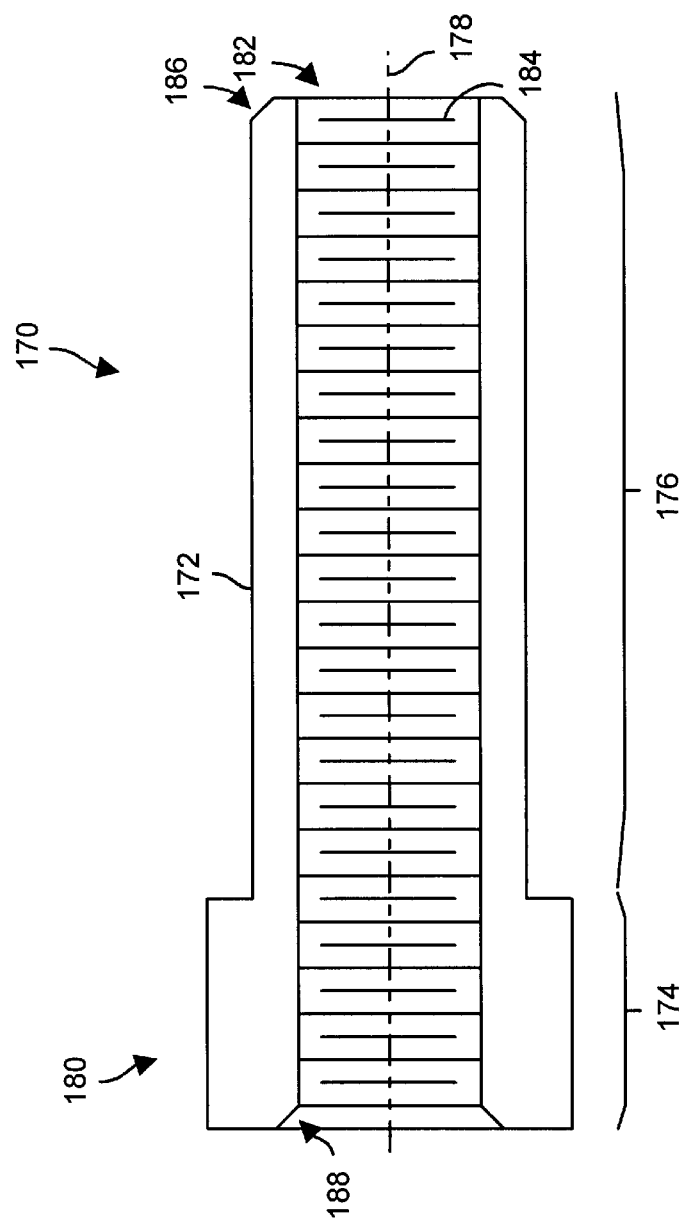
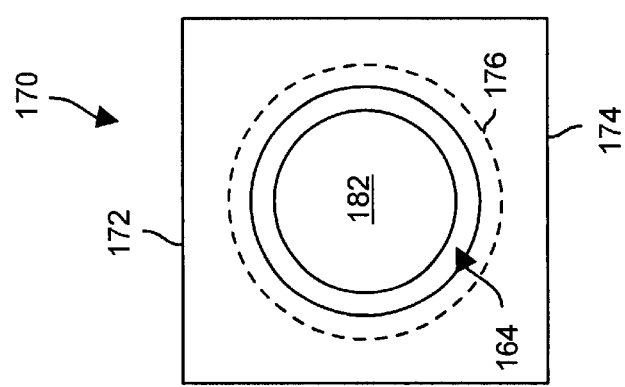
FIG. 9B
FIG. 9A

SYSTEMS AND METHODS FOR DISPOSING A CIRCUIT BOARD COMPONENT ON A CIRCUIT BOARD USING A SOLDERING PIN

BACKGROUND OF THE INVENTION

A typical circuit board includes vias (or plated through-holes) and pads which solder to pins to provide electrical access to particular conductors of the circuit board (e.g., signal conductors, power planes, ground planes, etc. of the circuit board). The pins can belong to an external circuit board component such as an integrated circuit (IC), or can be standalone to enable external access for testing purposes. A conventional standalone pin is described in U.S. Pat. No. 6,179,631, entitled "ELECTRICAL CONTACT FOR A PRINTED CIRCUIT BOARD" by Downes et al., the teachings of which are hereby incorporated by reference in their entirety.

Some circuit boards further include non-conductive holes (i.e., non-plated holes) through which large screws attach in order to support relatively large circuit board components. A conventional screw has a relatively uniform cylindrical shape with a larger-sized head. For example, to secure a row of connectors along an edge of a circuit board, some circuit board manufacturers drill holes along the edge, and insert such screws through the connectors and then through the drilled holes. The manufacturers then fasten nuts to the ends of the screws to firmly attach the connectors to the edge of the circuit board. As a result, stresses placed on the connectors are largely distributed through the screws to the circuit board rather than through more-fragile electrical connections between the circuit board and the connectors (e.g., rather than between circuit board vias and press-fit connector pins). Accordingly, the electrical connections between the circuit board and the connectors are unlikely to sustain damage during moments of high stress such as when the connectors of the circuit board mate with corresponding connectors of another circuit board (e.g., when the circuit board plugs into a backplane or motherboard).

Another common location for non-conductive holes on a circuit board is around interior component mounting locations. For example, a manufacturer can place screws through such non-conductive holes in order to attach a heat sink over one or more circuit board components. As another example, the manufacturer can place screws through non-conductive holes of a main circuit board to mount a relatively smaller secondary circuit board, e.g., a miniature circuit board with surface mount components called a multi-chip module (MCM), as is commonly done when attaching power converter circuitry to a main circuit board. As yet another example, when a circuit board component is soldered to an array of vias, the manufacturer can temporarily fasten alignment posts through non-conductive holes around the array of vias so that the alignment posts extend from the side of the circuit board opposite the component, and then lower a test fixture (e.g., a bed of nails) over the alignment posts to sample input and output signals of the component through the array of vias.

It should be understood that industry standards exist which specify particular mounts of conductor clearances that circuit board manufacturers must provide around vias and non-conductive holes. For example, the Institute for Interconnecting and Packaging Electronic Circuits (IPC) of Northbrook, Ill. defines Class 1 for home products, Class 2 for commercial grade products and Class 3 for military and high-reliability products. As another example, Underwriters Laboratories Inc. (UL) of Northbrook, Ill. sets related standards for such clearance areas. These clearance areas (i.e., non-conductor zones) are commonly referred to as "anti-pads". A manufacturer is not permitted to place electrical conductors (e.g., signal conductors, power planes, ground planes, etc.) within the anti-pad of a non-conductive hole unless that manufacturer is willing to avoid complying with the standard. Similarly, a manufacturer is only permitted to place the electrical conductor connecting to the via within the anti-pad of that via unless that manufacturer is willing to avoid complying with the standard.

SUMMARY OF THE INVENTION

Unfortunately, there are deficiencies associated with the above-described approaches to placing circuit board components on circuit boards using screws through drilled non-conductive holes. In particular, the anti-pads for such holes are quite large. For example, for a typical #8-32 (UNC) screw in certain applications, the anti-pad can be roughly a quarter of an inch or more. These relatively large anti-pads makes placement of conductors (e.g., signal etch) within the circuit board difficult especially in high density areas of etch such as around Ball Grid Array (BGA) component mounting locations, along a connector edge of the circuit board, etc. Circuit board manufacturers often have to re-route etches, and occasionally need to add wires or additional layers to the circuit boards in order to manufacture circuit boards in compliance with industry anti-pad standards.

The reason for the large anti-pads is that the diameters of the screws themselves are rather thick. Unfortunately, if the manufacturer used thinner screws, the thinner screws would not provide adequate stiffness and strength required for many applications. For example, the manufacturer would no longer be able to properly position and maintain many types of circuit board components such as connectors, mounting multi-chip modules (MCMs) or heat sinks, test fixtures, etc. when using thinner screws.

In contrast to the above-described conventional approaches to positioning circuit board components on circuit boards using screws which require relatively large anti-pads, the invention is directed to techniques for disposing circuit board components on circuit boards using pins which are configured to solder to the circuit boards. Soldering portions of the pins have relatively narrow diameters thus reducing the required anti-pad diameters. As a result, the circuit board manufacturer can maintain compliance with anti-pad industry standards, as well as adequately fasten the pins to the circuit boards with significant stiffness and strength. Engagement portions of the pins which extend from the circuit boards can have wider diameters in order to provide suitable rigidity for disposing a variety of circuit board components on the circuit boards.

One embodiment of the invention is directed to a pin for soldering to a circuit board. The pin includes a soldering portion which is configured to solder to a via of the circuit board and an engagement portion which is configured to engage with a circuit board component. The soldering portion has a circular cross-section and a soldering portion diameter. Similarly, the engagement portion has a circular cross-section and an engagement portion diameter. The soldering portion diameter is substantially narrower than the engagement portion diameter. Accordingly, the soldering portion can solder to relatively narrow circuit board via having a small anti-pad, and the thicker engagement portion can provide suitable strength for positioning the circuit board component in a reliable manner.

It should be understood that, since the circuit board can have smaller anti-pads around the mounting locations of the such pins, it is less difficult for the circuit board manufacturer to place etches around these mounting locations. Accordingly, it is less likely that the manufacturer will need to move etches or add wires or circuit board layers to comply with anti-pad industry standards. Moreover, the etches can be more openly and evenly distributed to promote better signal integrity due to the larger distances between signal etches and to provide fewer etch positioning constraints.

In one arrangement, the soldering portion of the pin is tapered so that becomes narrower toward the engagement portion. That is, the soldering portion has a first end which is nearer the engagement portion of the pin, and a second end which is further from the engagement portion. The first end has a narrower diameter than that of the second end. Accordingly, during the pin soldering process, there is more space around the via openings for gas to percolate and escape thus (i) minimizing the likelihood of trapping gas in the via, and (ii) enabling formation of a robust solder joint.

In one arrangement, the engagement portion of the pin is fashioned into a standardized end similar to a conventional screw and/or alignment post. Accordingly, circuit boards including the pin (or multiple pins) can accommodate conventional circuit board components such as test fixtures, heat sinks, circuit board modules (e.g., MCMs), connectors, frames, and supports.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

FIG. 9A is a top view of an anchor which is suitable for use with the pin of FIG. 1.

FIG. 9B is a cross-sectional side view of the anchor of FIG. 9A.

DETAILED DESCRIPTION

The invention is directed to techniques for disposing circuit board components on a circuit board using a soldering pin which is configured to solder to the circuit board. A soldering portion of the pin has a relatively narrow diameter thus reducing the required anti-pad diameter. As a result, the circuit board manufacturer can maintain compliance with anti-pad industry standards, as well as adequately fasten the pin to the circuit board with significant stiffness and strength. An engagement portion of the pin extends from the circuit board can have a wider diameter in order to provide suitable rigidity for disposing a circuit board component on the circuit board.

Figure 1:
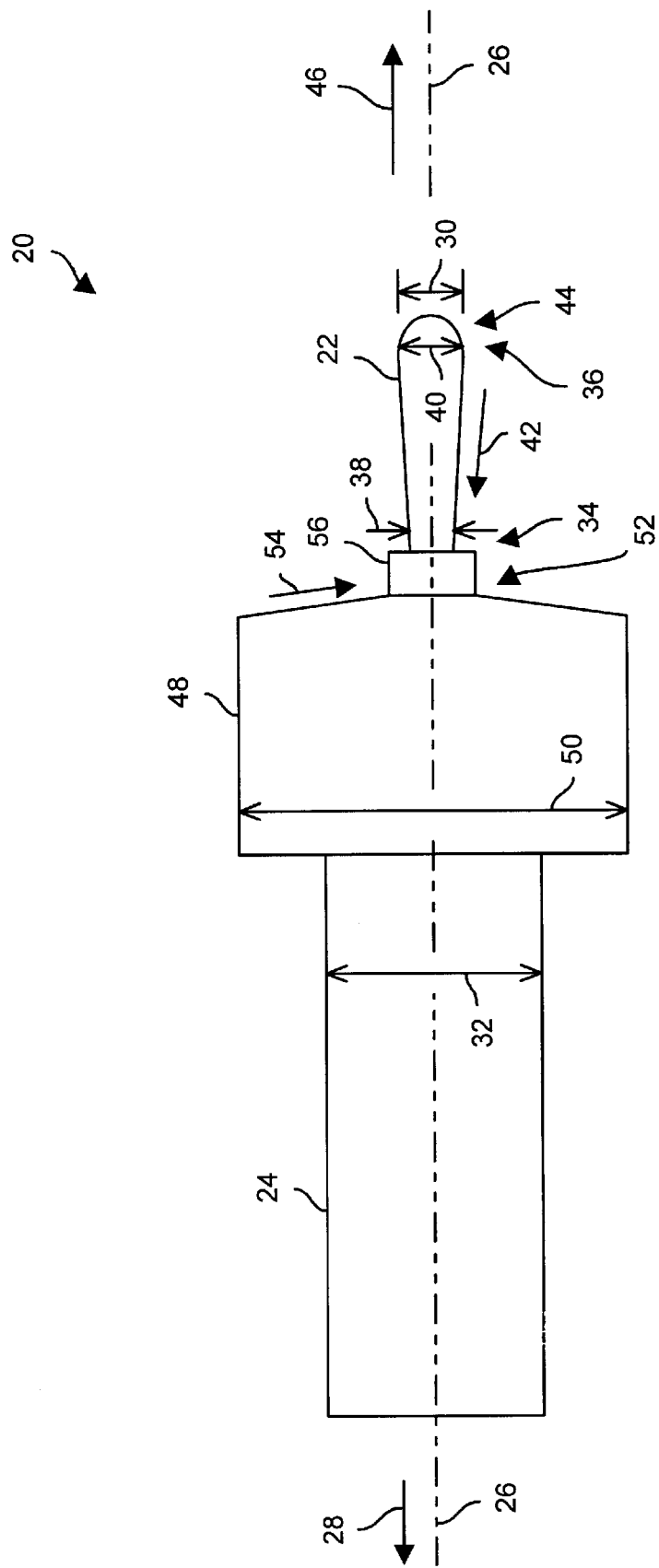
FIG. 1 is a block diagram of a soldering pin which is suitable for use by the invention.

FIG. 1 generally shows a soldering pin 20 which is suitable for use by the invention. The pin 20 includes a soldering portion 22 and an engagement portion 24 coupled to the soldering portion 22. In particular, the soldering portion 22 and the engagement portion 24 form a unitary member which defines a common central axis 26. The soldering portion 22 is configured to solder to a via (or plated through-hole) of a circuit board. The engagement portion 24 is configured to engage with a circuit board component in a direction 28 along the central axis 26.

As shown in FIG. 1, the soldering portion 22 has a soldering portion diameter 30 in a direction which is perpendicular to the central axis 26, and the engagement portion 24 has an engagement portion diameter 32 which is perpendicular to the central axis 26. The soldering portion diameter 30 is substantially narrower than the engagement portion diameter 32. Accordingly, the soldering portion 22 is well-suited for soldering to a circuit board via having a small anti-pad, and the engagement portion 24 is well-suited (e.g., provides sufficient strength) for positioning a circuit board component on the circuit board.

The soldering portion 22 has a first end 34 and a second end 36. The first end 34 is nearer to the engagement portion 24 than the second end 36. As shown in FIG. 1, a diameter 38 of the first end 34 is narrower than a diameter 40 of the second end 36 thus providing a taper 42 towards the engagement portion 24. The second end 36 has a rounded contour 44 (i.e., surface) to facilitate pin insertion in a direction 46 (which is opposite the direction 28) into a circuit board via during installation. The taper 42 of the soldering portion 22 facilitates gas percolation from the via during soldering to minimize the likelihood of trapping gas in the via, and to enable formation of a robust solder joint.

In one arrangement, the pin 20 further includes an intermediate flange portion 48 having an intermediate flange diameter 50 which is substantially wider than both the soldering portion diameter 30 and the engagement portion diameter 32. Accordingly, when the pin 20 solders to a circuit board, at least a portion 52 of the intermediate flange portion 48 adjacent the soldering portion 22 can make contact with the circuit board to distribute any stresses placed on the pin 20 and thus more-securely support the pin 20 relative to the circuit board. In one arrangement, the portion 52 of the intermediate flange portion 48 has a taper 54 to further facilitate gas percolation from the via during soldering.

In one arrangement, the pin 20 further includes a ring-shaped solder perform 56. The solder perform 56 provides the pin 20 with pre-disposed solder which melts during a soldering process (e.g., wave soldering, intrusive reflow soldering, etc.) and forms at least part of the solder joint which bonds the pin 20 to the circuit board via. Additional solder and/or flux can be provided over the via during installation in order to promote a healthy and reliable solder joint between the pin 20 and the circuit board via.

A suitable material for the pin 20 is electronic grade brass with nickel or tin overplates, as well as other conductor base alloys. Further details of the invention will now be provided with reference to FIG. 2.

Figure 2:
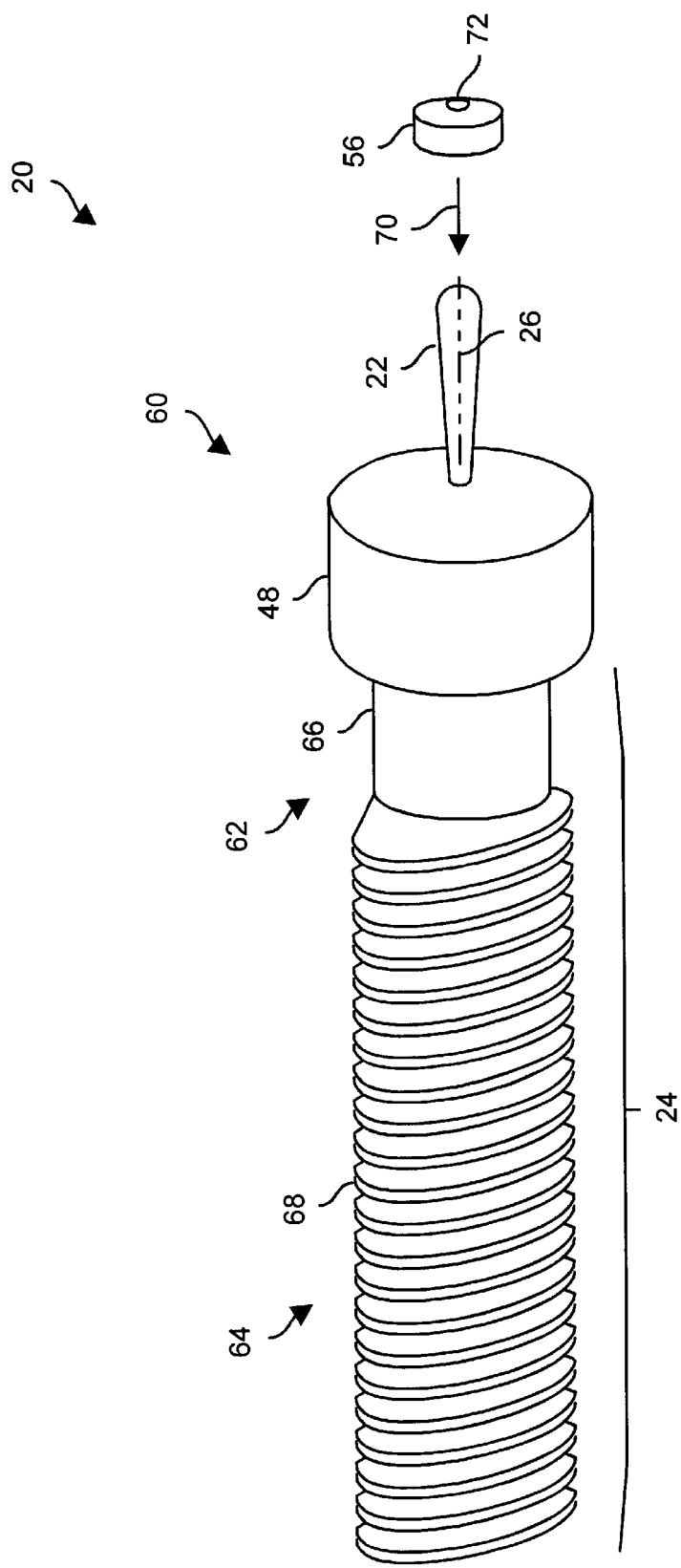
FIG. 2 is a perspective view of a first configuration for the pin of FIG. 1.

FIG. 2 is a perspective view of a first configuration 60 for the pin 20 of FIG. 1. The soldering portion 22 of the pin 20 is elongated along the central axis 26 and is configured to insert into and solder to a circuit board via. Each portion 22, 48 and 24 has a circular cross-section through the central axis 26. Accordingly, once the pin 20 is soldered to a circuit board via, the pin 60 provides strength in every direction.

For the configuration 60, the engagement portion 24 of the pin 20 includes a shaft section 62 and a fastening section 64. The shaft section 62 defines a relatively smooth surface 66. In contrast, the fastening section 64 defines threads 68 (e.g., standard #8-32 threads). The shaft section 62 interconnects the fastening section 64 to the engagement portion 48 of the pin 20. The threads 68 of the fastening portion 64 enable a variety of devices to attach thereto. For example, when the pin 20 is soldered to a circuit board, hardware (e.g., a nut) can thread onto the fastening section 64 to secure a circuit board component to the circuit board. As another example, the circuit board component itself (e.g., a bed of nails with a free-floating internally threaded anchor) can thread onto the fastening section 64.

As further shown in FIG. 2, the portions 22, 48, 24 can be manufactured separately as an integral part, and the solder preform 56 can then be applied over the soldering portion 22 of the pin 20. In particular, the solder preform 56 can be pushed in a direction 70 toward the pin 20 such that the soldering portion 22 of the pin 20 inserts through a hole 72 defined by the solder preform 56. Further details of the invention will now be provided with reference to FIG. 3.

Figure 3:
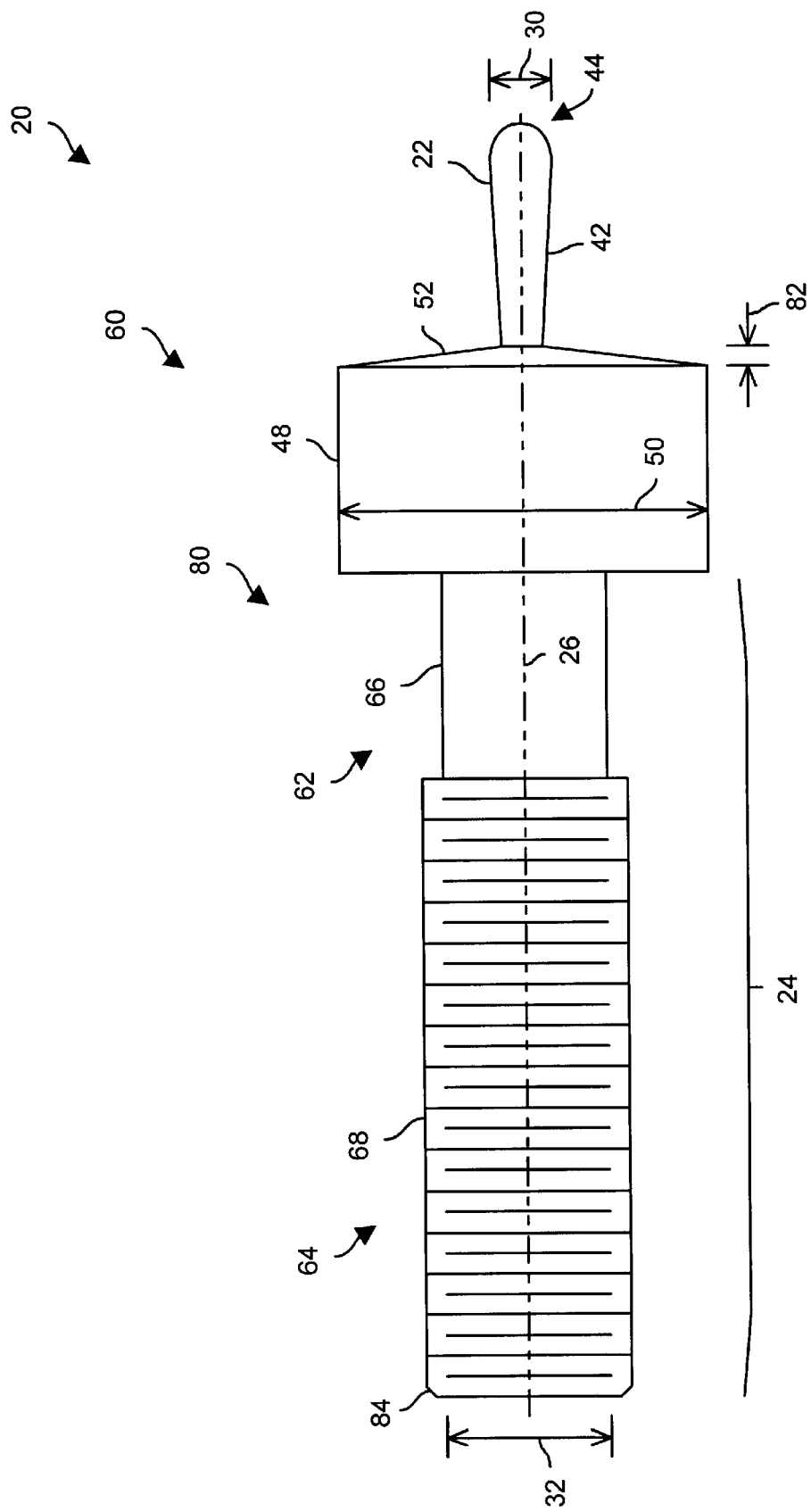
FIG. 3 is a side view of the first configuration of FIG. 2.

FIG. 3 is a side view 80 of the first configuration 60 for the pin 20 of FIG. 1. The diameter 30 of the soldering portion 22 is substantially narrower than then diameter 32 of the engagement portion 24. Furthermore, the diameter 50 of the intermediate flange portion 48 is substantially wider than (i) the diameter 32 of the engagement portion 24 and (ii) the diameter 30 of the soldering portion 22 in order to provide additional stability to the pin 20 when the pin 20 is soldered to a circuit board. Accordingly, the pin 20 is well-suited for soldering to a circuit board via having (i) a narrow diameter, as well as (ii) a narrow, but fully compliant anti-pad. As a result, circuit board manufacturer can derive the benefits of the pin 20 (e.g., using the pin 20 to position circuit board components) with minimal affects to placement of circuit board conductors (e.g., signal etch) within the circuit board.

It should be understood that the side view 80 of the pin configuration 60 is not necessarily drawn to scale, and the dimensions of the particular portions 22, 48 and 24 vary for particular arrangements. In one arrangement, the diameter 30 of the soldering portion 22 falls within a range of substantially 0.030 to 0.050 inches (i.e., the diameter of a cross-section through the soldering portion 22 in a substantially perpendicular direction to the central axis 26), the diameter 50 of the intermediate flange portion 48 falls within a range of substantially 0.150 to 0.300 inches, and the diameter 32 of the engagement portion 24 falls within a range of substantially 0.060 to 0.100 inches. In these arrangements and others, the ratio of the intermediate flange diameter 50 to the soldering portion diameter 30 falls within the range of substantially 8.0-to-1.0 and 5.5-to-1.0.

In a particular arrangement, the soldering portion diameter 30 is substantially 0.0325 inches, the intermediate flange diameter 50 is substantially 0.190 inches, and the engagement portion diameter 32 is substantially 0.070 inches. Unless otherwise noted, the term "substantially" in this context means within a particular tolerance range such as +/−10%, or a standard industry tolerance for error. In this arrangement, the ratio of the intermediate flange diameter 50 to the soldering portion diameter 30 is 5.85-to-1.0, i.e., 0.190 inches for the intermediate flange diameter 50 divided by 0.0325 inches for the soldering portion diameter 30.

In one arrangement, the length of the soldering portion 22 (along the central axis 26) is substantially 0.130 inches, the length of taper 82 of the intermediate portion 48 is substantially within a range of 0.012 to 0.015 inches, the length of the intermediate portion 48 (not including the taper 82) is substantially 0.125 inches, the length of the shaft section 62 of the engagement portion 24 is substantially 0.125 inches, and the length of the fastening section 64 is substantially 0.375 inches.

In one arrangement, the threads 68 of the fastening section 64 have a standard thread format (e.g., #8-32) to accommodate conventional off-the-shelf hardware (e.g., nuts, anchors, etc.) and circuit board components. In one arrangement, the threads 68 have a Stub Acme format to provide enhanced thread strength.

In one arrangement, the rounded contour 44 of the soldering portion 22 has a full radius to facilitate insertion into a circuit board via, and the end of the engagement portion 24 has a chamfer 84 (e.g., 45 degrees) to facilitate application of the circuit board component and/or associated hardware.

It should be understood that the intermediate flange portion 48 of the above-described pin configuration 60 is suitable for providing component displacement in addition to additional circuit board stability. In particular, multiple pins 20 having relatively longer intermediate flange portions 48 can be used as standoffs to provide separation between a main circuit board and a secondary circuit board (or other circuit board component). In one arrangement, the pins 20 separate the main circuit board and the secondary circuit board (e.g., first heat dissipation) as well as carry signals therebetween (e.g., power signals to circuitry on the secondary circuit board).

It should be understood that in a pin configuration 90, the diameter 32 of the engagement portion is at least twice as large as the diameter 30 of the soldering portion 22 for added strength. Further details of the invention will now be provided with reference to FIG. 4

Figure 4:
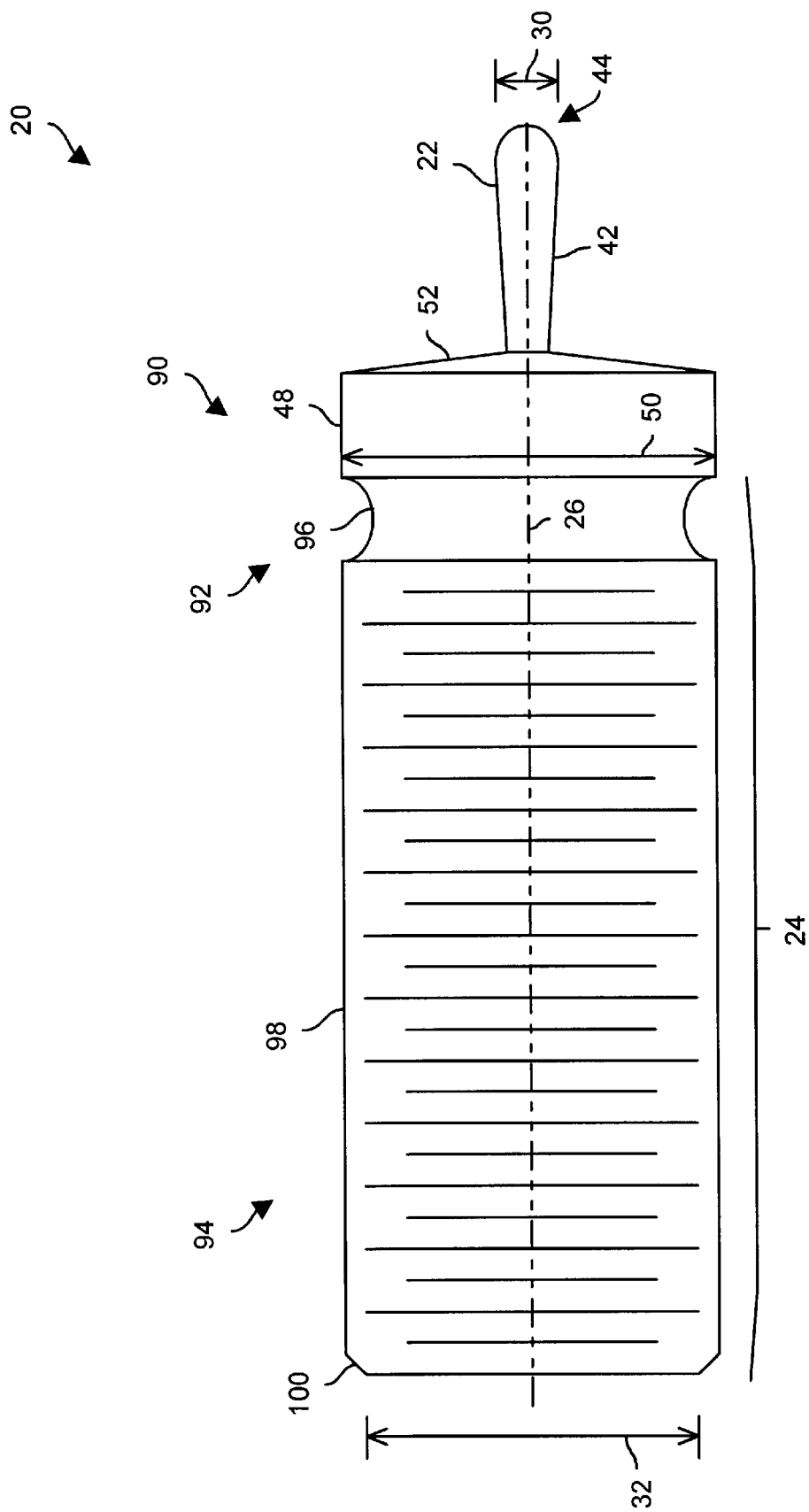
FIG. 4 is a side view of a second configuration for the pin of FIG. 1.

FIG. 4 is a side view of a second configuration 90 for the pin 20 of FIG. 1. Again, the diameter 30 of the soldering portion 22 is substantially narrower than the diameter 32 of the engagement portion 24. The features of the second pin configuration 90 which interface with the circuit board via are similar to those of the first pin configuration 60 (see FIG. 3). In particular, the diameter 50 of the intermediate flange portion 48 is substantially wider than the diameter 30 of the soldering portion 22 in order to provide additional stability to the pin 20 when the pin 20 is soldered to a circuit board via. Thus, the pin 20 is well-suited for soldering to a circuit board via having (i) a narrow diameter, as well as (ii) a narrow, but fully compliant anti-pad.

It should be understood that the side view of the pin configuration 90 is not necessarily drawn to scale, and the dimensions of the particular portions 22, 48 and 24 vary for particular arrangements. In one arrangement, the soldering portion diameter 30 is substantially 0.045 inches, the intermediate flange diameter 50 is substantially 0.190 inches, and the engagement portion diameter 32 is similar to the intermediate flange diameter 50 (i.e., substantially 0.190 inches).

In one arrangement, the length (along the central axis 26) of the soldering portion 22 is substantially 0.130 inches, the length of the intermediate portion 48 is substantially 0.050 inches, the length of a shaft section 92 of the engagement portion 24 is substantially 0.050 inches, and the length of a fastening section 94 is substantially 0.350 inches. The shaft section 92 has a rounded contour 96 to provide enhanced strength. The fastening section 94 has threads 98 to a circuit board component enable or hardware to fasten directly thereto.

In one arrangement, the threads 98 of the fastening section 94 have a standard thread format (e.g., #8-24, #¼-20, etc.) to accommodate conventional off-the-shelf hardware (e.g., nuts, anchors, etc.) and circuit board components. In one arrangement, the threads 98 have a Stub Acme format to provide enhanced thread strength.

In one arrangement, the rounded contour 44 of the soldering portion 22 has a full radius to facilitate insertion into a circuit board via, and the end of the engagement portion 24 has a chamfer 100 (e.g., 45 degrees) to facilitate application of the circuit board component and/or associated hardware. Further details of the invention will now be provided with reference to FIG. 5.

Figure 5:
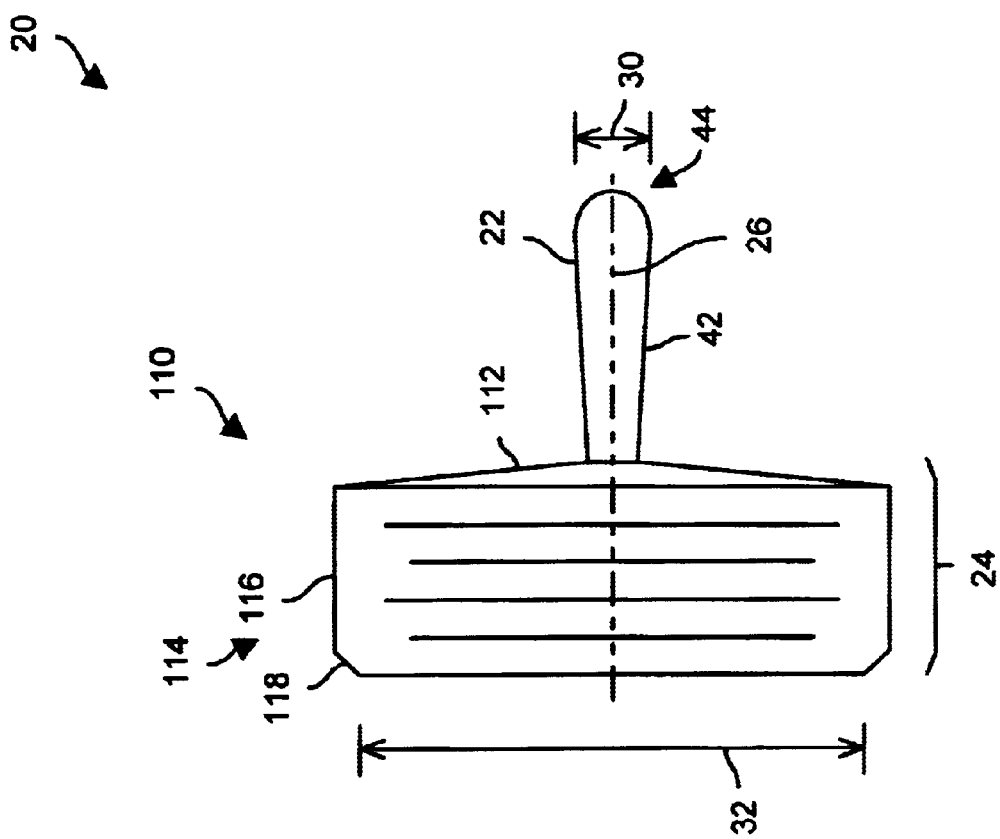
FIG. 5 is a side view of a third configuration for the pin of FIG. 1.

FIG. 5 is a side view of a third configuration 110 for the pin 20 of FIG. 1. Again, the diameter 30 of the soldering portion 22 is substantially narrower than the diameter 32 of the engagement portion 24. In contrast to the pin configurations 60, 90 in which the lengths of the engagement portions 24 substantially exceeded their widths (see FIGS. 3 and 4), the length of the engagement portion 24 is substantially shorter than the engagement portion diameter 32. In one arrangement, the length of the engagement portion is substantially 0.075 inches and the engagement portion diameter is substantially 0.250 inches, while the length of the soldering portion is substantially 0.130 inches. When multiple pins 20 having the configuration 110 are soldered to circuit boards (e.g., in a square, rectangular or triangular arrangement), the pins 20 having the configuration 110 are particularly well-suited for aligning and/or fastening test fixtures such as bed-of-nails assemblies to circuit boards. For example, such test fixtures can have rotatable nuts fastened to their housings so that automated equipment or techniques can place the test fixtures over the pins 20, and then turn the rotatable nuts to secure the test fixture reliably in place over the circuit boards (e.g., over arrays of pads for sampling IC I/O signals).

It should be understood that the intermediate flange portion is omitted from the pin configuration 110. Accordingly, the engagement portion 24 itself has a taper 112 to facilitate gas ventilation during pin soldering. The engagement portion 24 further does not include a shaft section but does include a fastening section 114 having threads 116 and a chamfer 118 (e.g., 0.010 inches in length at 45 degrees) to facilitate circuit board component alignment.

In one arrangement, the threads 112 have a standard thread format (e.g., #¼-16) to accommodate conventional off-the-shelf hardware (e.g., nuts, anchors, etc.) and circuit board components. In one arrangement, the threads 112 have a Stub Acme format (e.g., 0.88 revs) to provide enhanced thread strength. Further details of the invention will now be provided with reference to FIG. 6.

Figure 6:
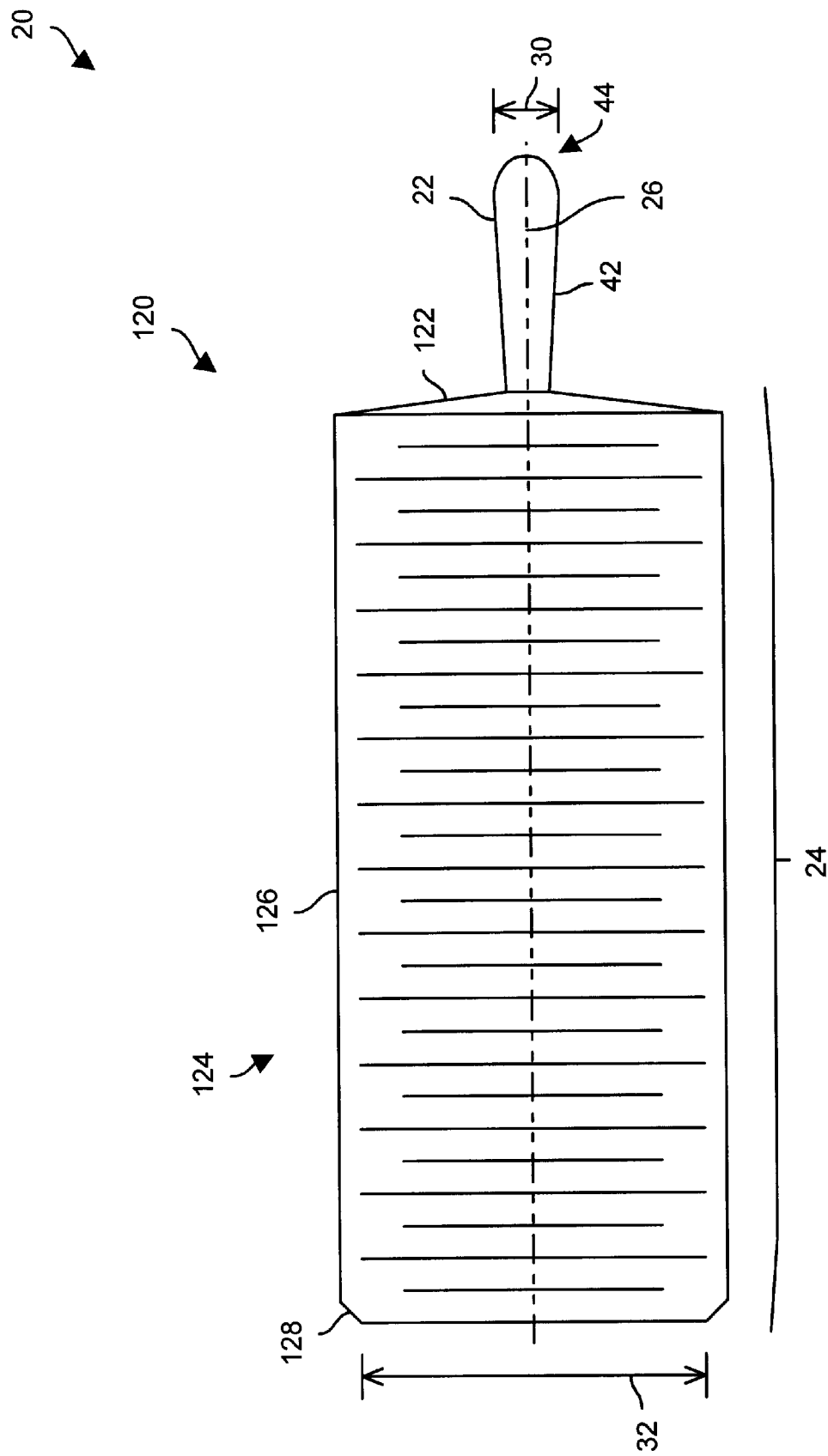
FIG. 6 is a side view of a fourth configuration for the pin of FIG. 1.

FIG. 6 is a side view of a fourth configuration 120 for the pin 20 of FIG. 1. This configuration 120 is similar to the configuration 110 (also see FIG. 5). In particular, the configuration 120 omits the intermediate flange portion and the diameter 32 of the engagement portion 24 is substantially wider than the diameter 30 of the soldering portion 22. The engagement portion 24 has (i) a taper 122 to facilitate gas ventilation during soldering and (ii) a fastening section 124 having threads 126.

In contrast to the pin configuration 110 of FIG. 5, the pin configuration 120 of FIG. 6 has an engagement portion 24 which is substantially longer along the central axis 26 than the diameter 32. In one arrangement, the engagement portion 24 is substantially 0.450 inches in length while other features of the pin configuration 120 are similar to those of the pin configuration 110 (FIG. 5).

The significant width of the pin configuration 120 makes this configuration well-suited for many applications requiring high strength. For example, when multiple pins 20 having the configuration 120 are soldered to circuit boards (e.g., in a square or rectangular arrangement), the pins 20 having the configuration 120 are particularly well-suited for securing test fixtures, secondary circuit boards and heat sinks.

In one arrangement, the threads 126 have a standard thread format (e.g., #¼-16) to accommodate conventional off-the-shelf hardware (e.g., nuts, anchors, etc.) and circuit board components. In one arrangement, the threads 126 have a Stub Acme format (e.g., 0.88 revs) to provide enhanced thread strength. A chamfer 128 facilitates component and/or hardware alignment over the pin 20.

It should be understood that further modifications and enhancements can be made to the above-described pin configurations 60, 90, 110 and 120. Further details of the invention will now be provided with reference to FIG. 7.

Figure 7:
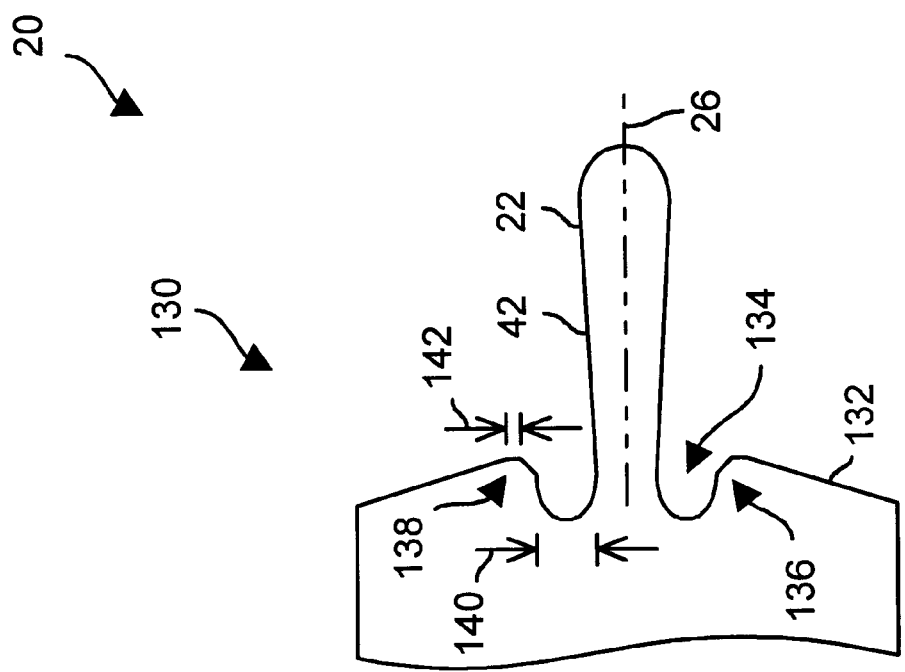
FIG. 7 is a view of an alternative mounting portion of the pin for FIG. 1.

FIG. 7 shows a variation to a mounting portion 130 of the pin configurations 60, 90, 110 and 120. The mounting portion 130 is similar to the intermediate flange portion 48 of FIGS. 3 and 4 and the engagement portions 24 of FIGS. 5 and 6 in that a taper 132 exists toward the soldering portion 22. However, a circular-shaped grooved surface (or channel) 134 is defined around the attachment area of the soldering portion 22. This surface 134 further facilitates gas ventilation from the circuit board via during the soldering process. In particular, gas from the via can percolate into the grooved area 134 to enable formation of a healthy and robust solder joint. The gas is then mechanically driven out, and any micro-void within the grooved area 134 does not affect fastening strength. To the contrary, the additional surface area provided by the grooved area 134 acts to pull the pin 20 down. That is, the additional wetted surface area draws the pin 20 in closer to and further into the via during the soldering process for improved fastening.

As shown in FIG. 7, an outer portion of the circular-shaped grooved surface, 134 bevels at an angle 136 (e.g., a 30 degree angle from the central axis 26) and levels off to a flattened surface 138 which is substantially perpendicular to the central axis 26. The angle 136 facilitates gas ventilation. The flattened surface 138 is configured to contact the circuit board surface (e.g., non-conductive fiberglass, a pad, etc.) to provide additional stability to the pin 20 and to distribute stress between the pin and the circuit board so that less stress is placed on the solder joint holding the soldering portion 22 to the circuit board via.

In one arrangement, the circular-shaped grooved surface 134 has a width in the range of substantially 0.001 and 0.020 inches, and the flattened surface 138 has a width in the range of substantially 0.005 and 0.007 inches. In a particular arrangement, the circular-shaped grooved surface 134 has a width which is substantially 0.015 inches, and the flattened surface 138 has a width which is substantially 0.006 inches. Such arrangements are suitable for any of the above-described pin configurations 60, 90, 110 and 120. Further details of the invention will now be provided with reference to FIG. 8.

Figure 8:
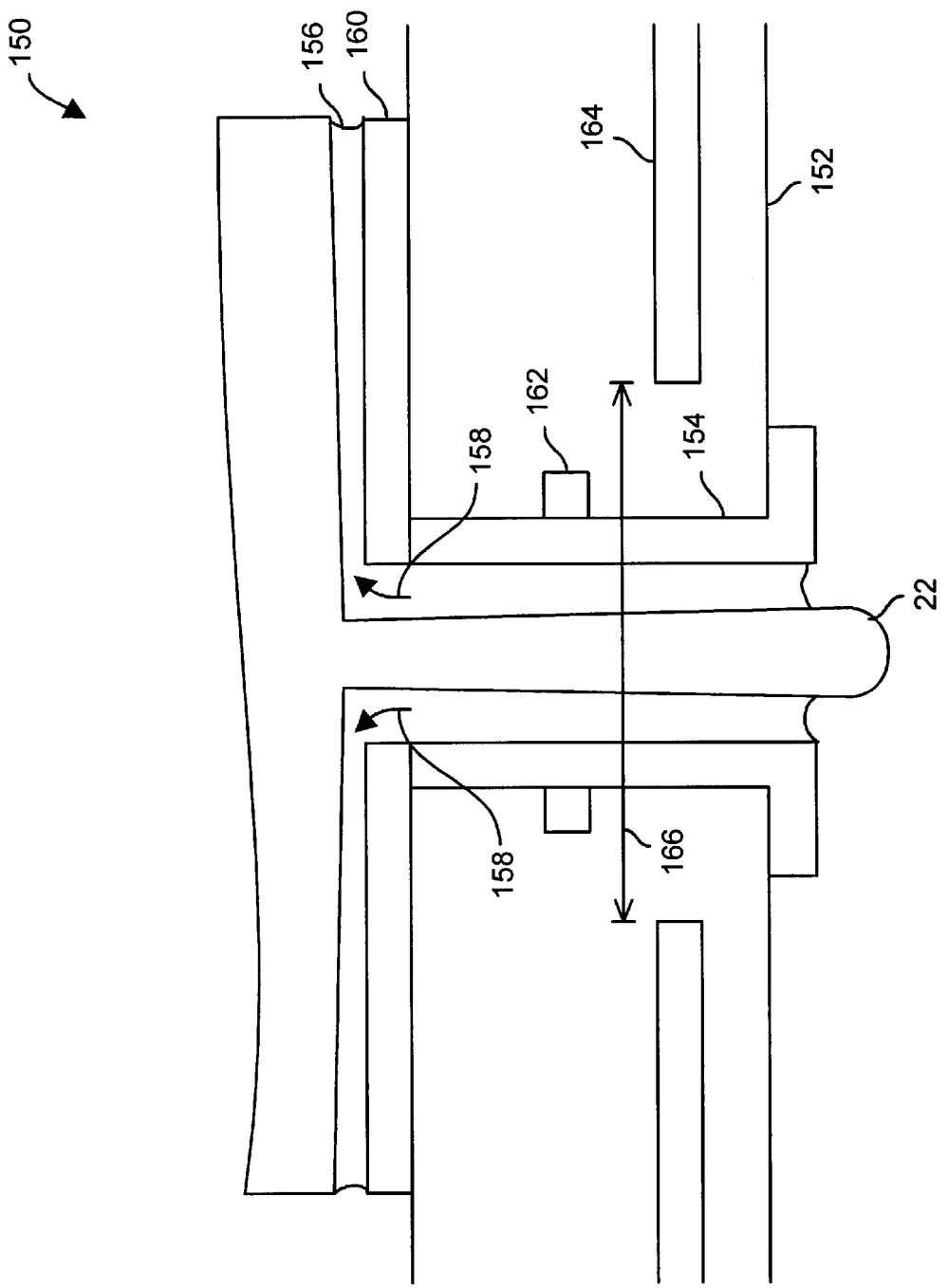
FIG. 8 is a cross-sectional side view of a mounting portion of the pin of FIG. 1 when soldered to a circuit board.

FIG. 8 shows a cross-sectional view 150 of the pin 20 when soldered to a circuit board 152. In particular, the soldering portion 22 of the pin 20 is robustly bonded to a circuit board via 154 by a solder joint 156. In one arrangement, the pin 20 originally included a solder perform 56 (see FIGS. 1 and 2), and at least a portion of the solder of the solder joint 156 originated from that solder perform 56. It should be clear from the cross-sectional view 150, that the slight taperings of the pin 20 facilitated gas ventilation from the via in the direction 158 during the soldering process to form the healthy solder joint 156.

By way of example only, the circuit board 152 further includes a pad 160 and an internal conductor 162. The pad 160 further facilitates bonding of the pin 20 to the circuit board 152 due to the increase surface area of the solder joint. The internal conductor 162 enables the pin 20 to carry a signal from the circuit board 152 to an external circuit board component (e.g., a secondary circuit board which the pin 20 also supports and secures to the circuit board 152).

Also shown in FIG. 8 is a power plane 164 (e.g., a ground plane) and its associated anti-pad 166 around the via 154. It should be clear that narrow diameter of the solder portion 22 enables the via 154 to have a relatively narrow diameter vis-à-vis conventional non-plated holes for larger diameter screws (e.g., #8-32 screws). In one arrangement, the via 154 provides a small 0.004 inch clearance to the soldering portion 22 of the pin 20 (i.e., a 0.002 inch clearance on each side of the pin) when factoring in the widest pin (e.g., when factoring in the worst case of a +/−0.001 inch diameter error for the pin) and the narrowest via (e.g., when factoring in the worst case of a +/−0.002 inch diameter error for the via). Accordingly, the anti-pad 166 can have a relatively small diameter as well in order to provide less constraints on conductors in the vicinity of the via 154.

It should be understood that, once a set of pins 20 (one or more pins 20) has been soldered to the circuit board 152, a circuit board component can easily be disposed on the circuit board 152. In one arrangement, the circuit board component is placed on the circuit board 152 so that holes of the component align with pins 20 extending from the circuit board 152, and then threaded hardware (e.g., nuts, anchors, etc.) engages the engagement portions 24 of the pins 20 to secure the circuit board component to the circuit board 152. Further details of the invention will now be provided with reference to FIGS. 9A and 9B.

FIGS. 9A and 9B show an anchor 170 which is suitable for fastening to the pin 20 of FIG. 1. FIG. 9A shows a top view of the anchor 170, and FIG. 9B shows a cross-sectional side view of the anchor 170. By way of example only, the anchor 170 has a body 172 which defines a head 174 and a secondary portion 176. The head 174 is configured to enable automated equipment or a technician to turn the anchor about a central axis 178. In one arrangement, an end 180 of the head 172 has a shape (e.g., a rectangular shape, a hexagonal shape, a slit, an inverted plus-shape, an inverted star-shape, an inverted hexagonal shape, etc.) which enables a tool head to turn the anchor 170 about the axis 178. In another arrangement, the end 180 has a textured surface or wing-shape to enable a technician to hand-turn the anchor 170.

The body 172 of the anchor 170 further defines a cavity 182 having inner facing threads 184. The inner facing threads 184 are configured to match the threads of the pin engagement portion 24 of the pin 20 so that the anchor 170 engages the pin 20, i.e., threads onto the pin 20 in a direction along the pin central axis 26 as the anchor 170 rotates. In one arrangement, the secondary portion 176 of the anchor 170 is configured to insert into a circuit board component hole (e.g., has a circular-shaped cross-section) rather than simply contact an outer surface of the component in a flush manner, and the body 172 further defines an outer chamfer 186 to enable the anchor 170 to align with that hole. In one arrangement, the body 172 includes an inner chamber 188 to remove any burrs or debris from the manufacturing process. In one arrangement, the anchor 170 is configured to rotatably float within a circuit board component (e.g., a test fixture) so that the anchor 170 does not inadvertently separate from the component. Further details of the invention will now be provided with reference to FIG. 10.

Figure 10:
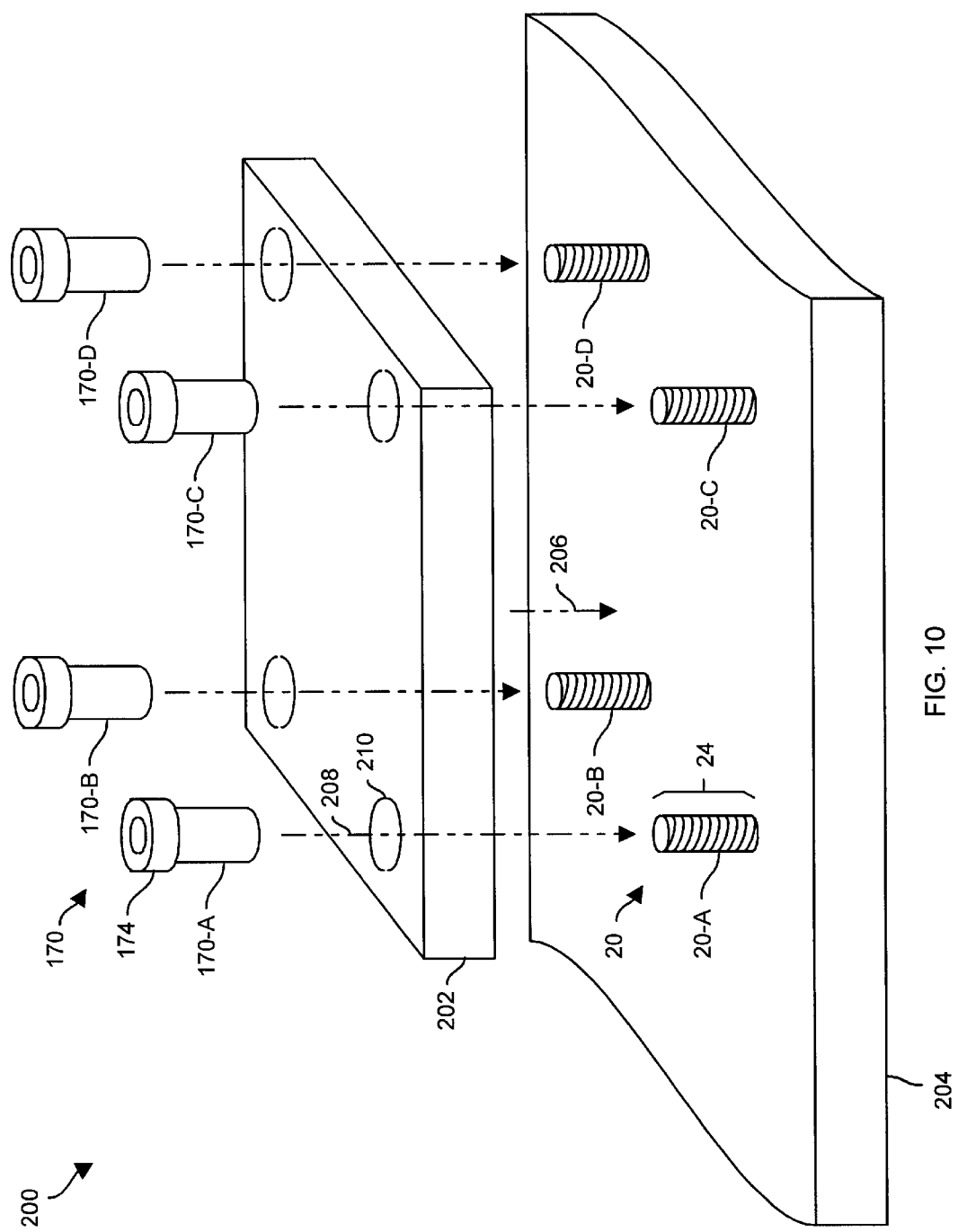
FIG. 10 is an exploded view of a connection system for disposing a circuit board component on an interior location of a circuit board using the pin of FIG. 1.

FIG. 10 is an exploded view of a connection system 200 for disposing a circuit board component 202 (e.g., a test fixture, another circuit board, a heat sink, etc.) on an interior location of a circuit board 204 using the pin 20 (i.e., pins 20-A, 20-B, 20-C, 20-D) of FIG. 1. First, the circuit board component 202 moves in a direction 206 onto the circuit board 204. Next, the anchors 170 (i.e., anchors 170-A, 170-B, 170-C 170-D) move in the direction 208 and thread onto the engagement portions 24 of the pins 20 to secure the circuit board component 202 to the circuit board 204. The heads 174 of the anchors 170 are shown by way of example only as having circular-shaped cross-sections in a textured thumbscrews configuration. In particular, as the anchors 170 engage with the engagement portions 24 of the pins 20, the anchors 170 themselves insert into holes 210 of the component 202. Further details of the invention will now be provided with reference to FIG. 11.

Figure 11:
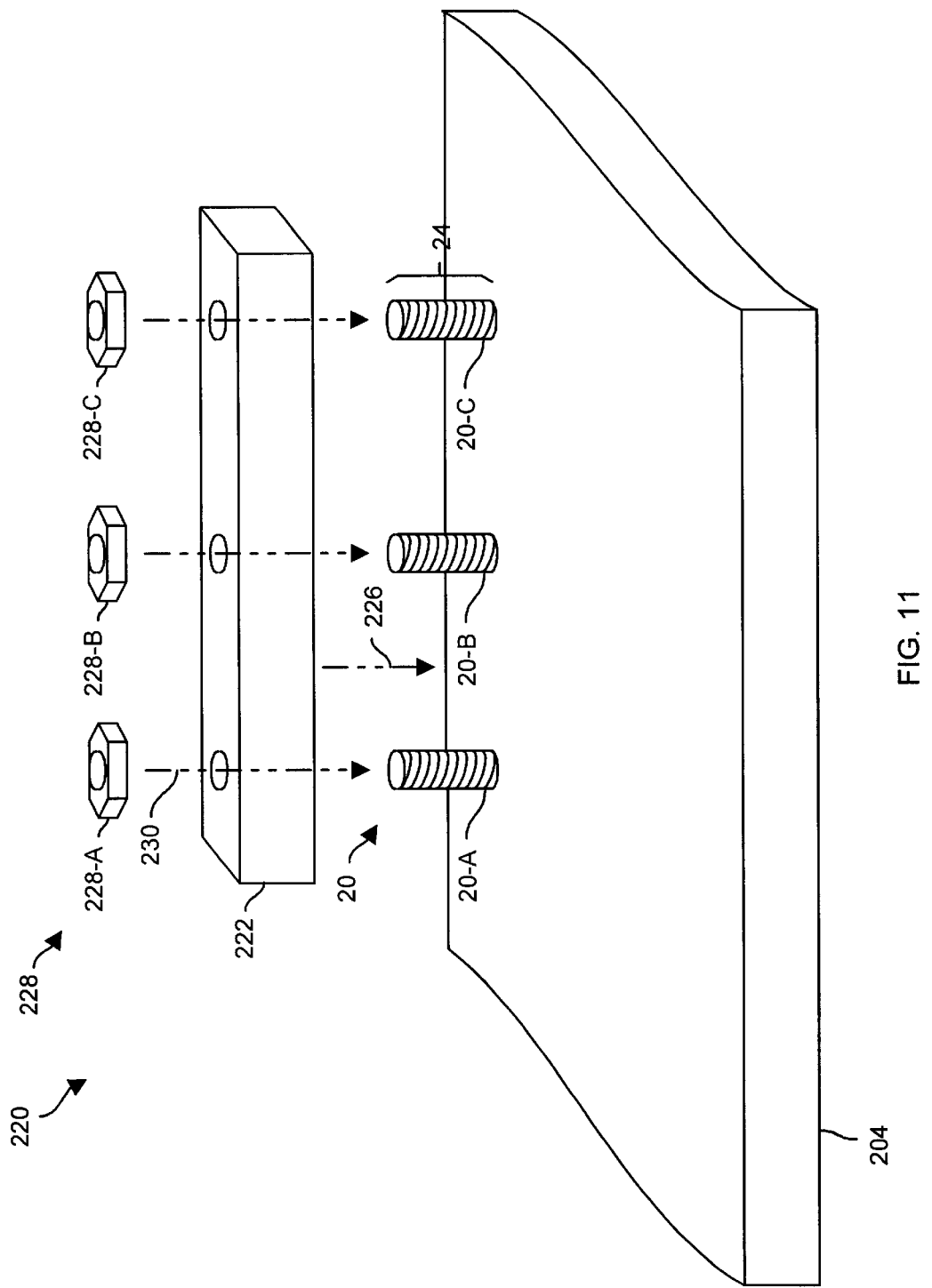
FIG. 11 is an exploded view of a connection system for disposing a circuit board component on a periphery of a circuit board using the pin of FIG. 1.

FIG. 11 is an exploded view of a connection system 220 for disposing a circuit board component 222 (e.g., an edge connector, a frame member, an edge support, etc.) on an edge location of a circuit board 224 using the pin 20 (i.e., pins 20-A, 20-B, 20-C) of FIG. 1. First, the circuit board component 222 moves in a direction 226 onto the circuit board 224. Next, conventional hardware 228 (i.e., nuts 228-A, 228-B, 228-C) moves in the direction 230 and threads onto the engagement portions 24 of the pins 20 to secure the circuit board component 222 to the circuit board 224. By way of example only, the hardware 228 has shapes (e.g., hexagonal or square shapes) which enable a tool (e.g., a wrench) to grasp the hardware 228 and manipulate the hardware 228 so that the hardware 228 engages with the engagement portions 24 of the pins 20. By way of example only, the hardware 228 is configured to rest flush on a top surface 232 of the component 222. Further details of the invention will now be provided with reference to FIG. 11.

Figure 12:
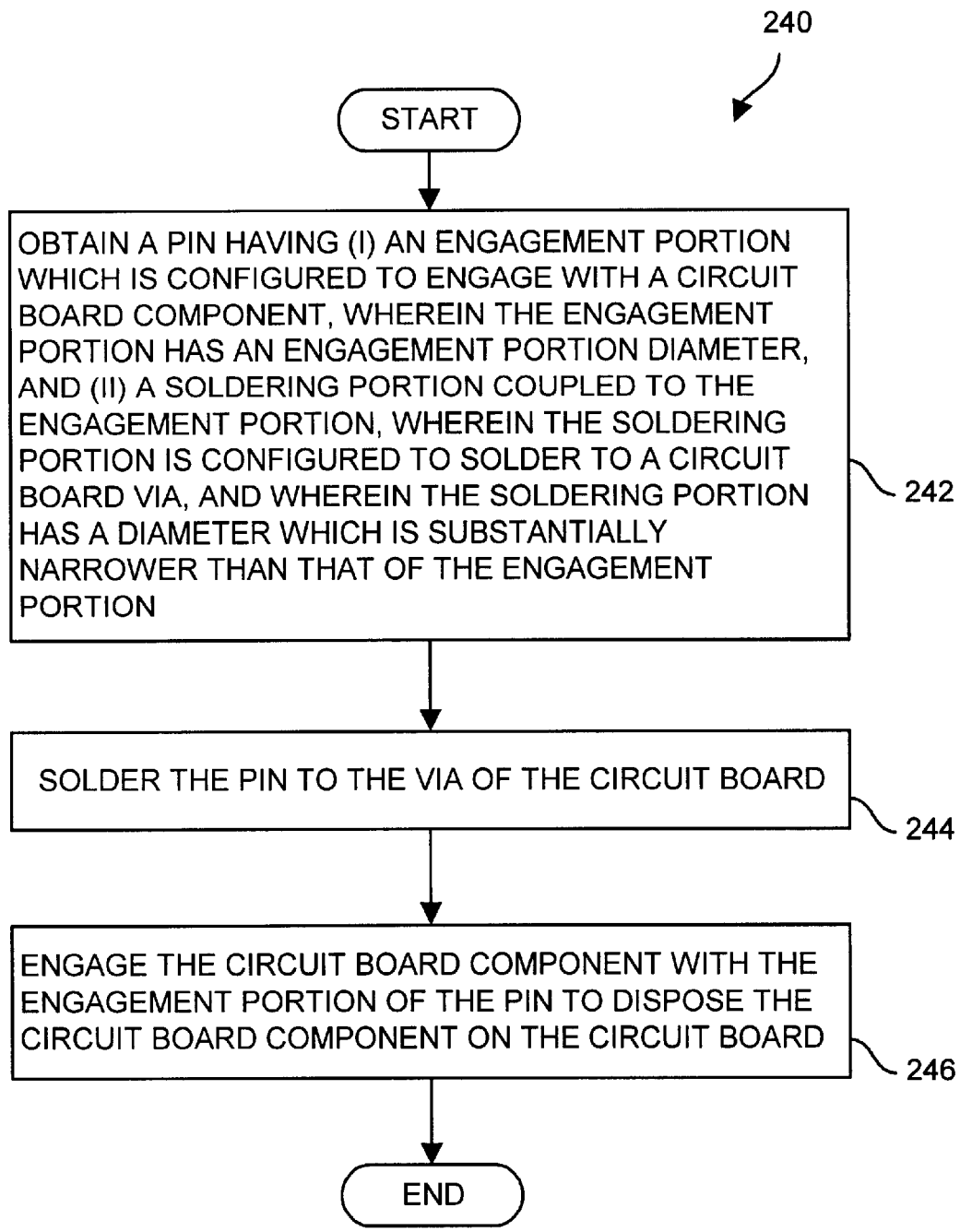
FIG. 12 is a flowchart of a procedure for disposing a circuit board component on a circuit board using the pin of FIG. 1.

FIG. 12 shows a flowchart of a procedure 240 performed by a user (e.g., a technician, an operator of automated equipment, etc.) to dispose a circuit board component on a circuit board. In step 242, the user obtains a pin having (i) an engagement portion which is configured to engage with a circuit board component (e.g., see the engagement portion 24 of FIG. 1), and (ii) a soldering portion which is configured to solder to a circuit board via. The soldering portion has a diameter which is substantially narrower then that of the engagement portion thus enabling the use of a narrower via and anti-pad.

In step 244, the user solders the pin to the via of the circuit board. In one arrangement, the user uses soldering process such as an intrusive reflow soldering process to solder the pin to the circuit board. In one arrangement, the pin includes a solder perform that melt and forms at least a portion of the solder joint that holds the pin to the circuit board. The soldering portion now substantially resides in the circuit board via, and the engagement portion of the pin now extends from the surface of the circuit board.

In step 246, the user engages the circuit board component with the engagement portion of the pin to dispose the circuit board component on the circuit board. In particular, the user aligns the circuit board component so that the engagement portion of the pin inserts through a hole of the component. As a result, the circuit board component is now disposed on the circuit board. Additionally, the via of the circuit board has a narrow diameter thus enabling a narrower anti-pad. Accordingly, there are less constraints on conductors within the circuit board in the vicinity of the via. Such a configuration permits the manufacturer of the circuit board to maintain compliance with anti-pad standards without less likelihood of having to move conductors such as by adding wires or additional circuit board layers, particularly in areas of high congestion such as around high-density components (e.g., BGA mounting locations, electrical edge connectors, etc.).

The invention is directed to techniques for disposing circuit board components on a circuit board using a soldering pin 20 which is configured to solder to the circuit board. A soldering portion 22 of the pin 20 has a relatively narrow diameter 30 thus reducing the required anti-pad diameter. As a result, the circuit board manufacturer can maintain compliance with anti-pad industry standards, as well as adequately fasten the pin 20 to the circuit board with significant stiffness and strength. An engagement portion 24 of the pin 20 which extends from the circuit board can have a wider diameter 32 in order to provide suitable rigidity for disposing a circuit board component on the circuit board.

The pin 20 has a variety of uses such as fastening mechanical stiffeners (e.g., bars) to a circuit board to provide additional circuit board rigidity to the circuit board. Another use is to fasten a circuit board frame or connector to the circuit board to distribute force along the circuit board during circuit board installation (e.g., as levers urge the circuit board into engagement with a backplane). Another use is to fasten a heavy component (e.g., a power converter) to the circuit board and distribute stresses of that component so that solder joint connections between the circuit board and the component are not damaged. Another use is to provide separation between a heavy component (e.g., a secondary circuit board) and the circuit board in a manner similar to that of a "standoff" and thus provide component clearance for heat dissipation as well as perhaps carry electrical signals (e.g., power signals). Another use is to bolt a heat sink to the circuit board and/or components for enhanced cooling. Another use is to hold a test fixture (e.g., a bed-of-nails) in place so that I/O signals of a component (e.g., a BGA device) can be sampled.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that multiple pins 20 can be used to dispose a single circuit board component to a circuit board. Although a single pin 20 is acceptable, the examples of FIGS. 10 and 12 show the application of multiple pins 20. Accordingly, stresses placed on the component are more evenly distributed across such pins 20.

Additionally, it should be understood that a circuit board can use a combination of pins with different pin configurations. For example, the circuit board can use pins 20 having the pin configuration 60 of FIGS. 2 and 3 to secure an edge connector to an edge of the circuit board, and simultaneously use pins 20 having the pin configuration 120 of FIG. 6 to attach a test fixture to the circuit board.

Furthermore, it should be understood that the pin 20 was described above as having a circular cross-section by way of example only. In other arrangements, the pin has enhanced shapes such as a flat, rectangular shape to enable the pin to flex in a particular direction for certain applications, a hook or eyehole shape for attaching various other elements, other features, etc. In one arrangement, the soldering portion 22 has a thread which extends from the circuit board after the soldering process, and hardware (e.g., a nut, an anchor, etc.) fastens to the soldering portion 22 for additional bonding. In another arrangement, the engagement portion 24 of the pin 20 provides a cylindrical-shaped post with an internal thread to receive threaded hardware therein (e.g., a screw).

In another arrangement, the engagement portion 24 provides a ball-shaped end that enables an external member to clamp over the ball-shaped end in a ball-and-socket-like manner. This arrangement, is well-suited for applications requiring appendages (e.g., standard length appendages, relatively longer appendages, etc.) that extend from the circuit board surface, e.g., a heat sink device that derives support from multiple pins 20 and from the circuit board, rather than completely deriving support from a soldered-in circuit board component. Accordingly, stresses placed on the heat sink will not over-stress the circuit board component or the solder joints mounting the component to the circuit board. The ball-shaped end enables appendages to swivel (e.g., pivot about the ball-shaped end) to accommodate variations from device to device, i.e., to avoid placing too much stress on an external device, the pin, the solder joint or the circuit board by otherwise forcing rigidly extending posts to conform and support the external device. Rather, the appendages (e.g., circuit board standoffs) can swivel (e.g., turn, rotate, move to a slight angle, etc.) to provide self-alignment and accommodate tolerance differences from device to device for a less stressful connection. Moreover, the appendages themselves can be tailored to receive other hardware, e.g., can provide threaded holes to receive threaded screws, can provide holes to accommodate self-tapping screws, etc.

Figure 13:
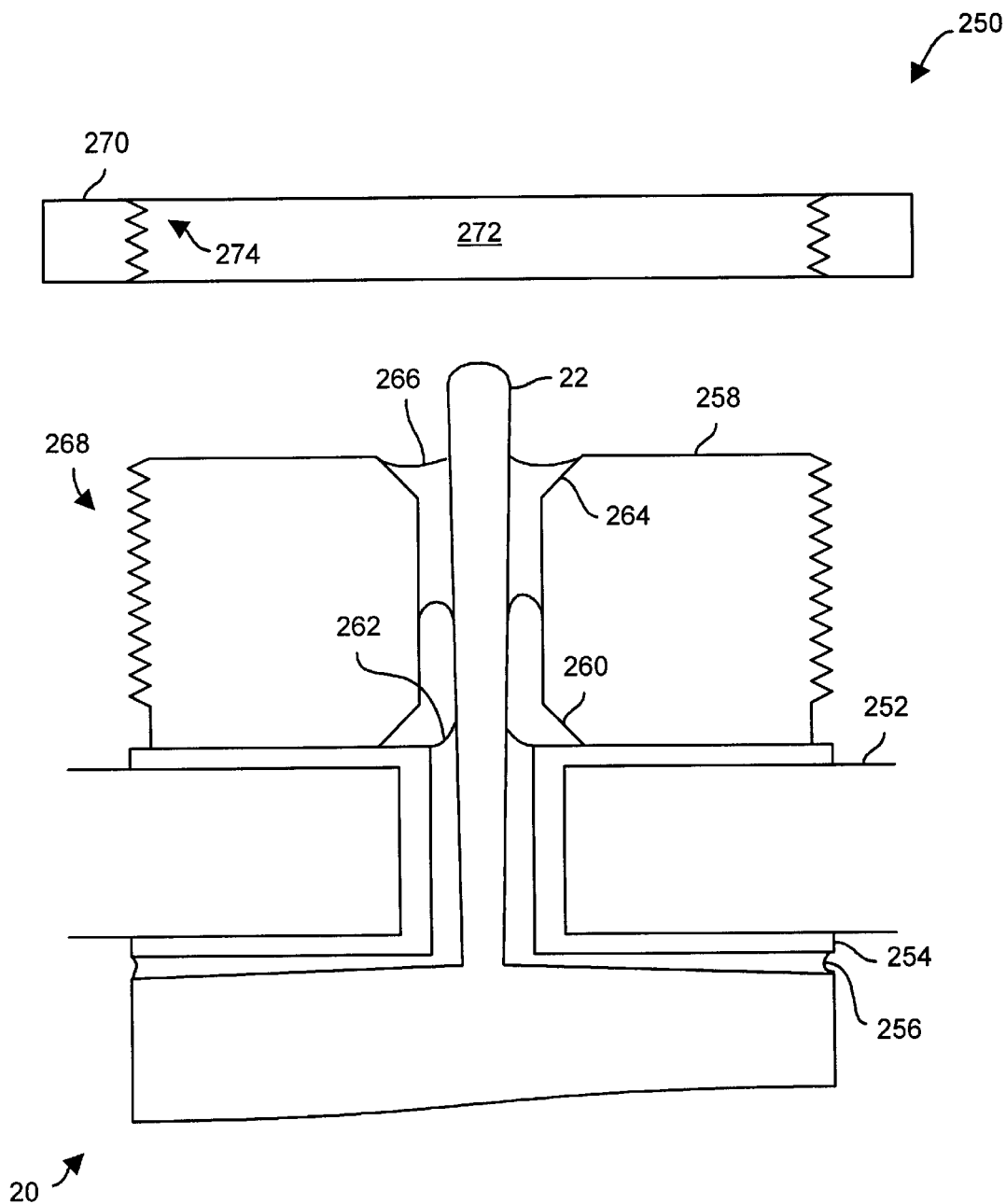
FIG. 13 is a cross-sectional side view of a mounting portion of the pin of FIG. 1 when soldered to a circuit board and a collar/bushing.

Another arrangement of the invention is shown in FIG. 13. FIG. 13 shows a cross-sectional view 250 of the pin 20 when the pin 20 is (i) configured with an extra long soldering portion 22 and (ii) soldered to a circuit board 252. In particular, the pin 20 is initially soldered to the circuit board 252 through a via 254. Such soldering can occur in a manner similar to that explained above in connection with the arrangements of FIG. 8 to form a robust and reliable solder joint 256 (e.g., with the pin 20 pointing down, rather up as shown in FIG. 13).

Subsequently, the manufacturer turns the circuit board 252 upside (to the orientation shown in FIG. 13) and slides a collar 258 (e.g., a metallic bushing) over the remaining end of the extra long soldering portion 22. The manufacturer then solders the collar 258 to the pin 20 in a second soldering operation. The end result is a well-secured pin/collar configuration (soldered on both sides) that provides mounting capabilities for an external device.

As shown in FIG. 13, the collar 258 defines a chamfer 260 to accommodate any solder 262 (e.g., a fillet) that extends from the via 254. Without such a chamfer 260, there is the possibility that the collar 258 would not seat fully flush on the circuit board 252 (e.g., the collar 258 could otherwise sit crooked or leave a space between the collar surface and the circuit board/via surface, etc.).

The collar 258 further defines a chamfer 264 to facilitate entrance of solder 266 between the collar 258 and the pin soldering portion 22, and to encourage gas to escape. As shown in FIG. 13, it is acceptable for the solder 266 to flow between the collar 258 and the pin solder portion 22 without traveling completely down to the solder 256 from the initial soldering process.

By way of example only, the collar 258 further defines an external thread 268 to enable an external device to attach thereto. For example, the collar 258 can then be placed through a hole of a heat sink device, a test fixture, etc., and then a nut 270 having a threaded hole 272 can be screwed onto the collar 258 to hold the heat sink device to the circuit board 252. Internal threads 274 of the nut match the threads 268 of the collar for a secure fit.

It should be understood that any of the above-described configurations can be combined. For example, the collar 258 could alternatively define a ball-shaped head or an internally threaded head for other applications, as described earlier. Such modifications and enhancements are intended to belong to embodiments of the invention.

What is claimed is:

1. A pin for soldering to a circuit board, the pin comprising:
   an engagement portion which is configured to engage with a circuit board component, wherein the engagement portion has a circular cross-section and an engagement portion diameter; and
   a soldering portion coupled to the engagement portion, wherein the soldering portion is configured to solder to a via of the circuit board, wherein the soldering portion has a circular cross-section and a soldering portion diameter which is substantially narrower than the engagement portion diameter, wherein the soldering portion has a first end and a second end, wherein the second end is further from the engagement portion than the first end, wherein the second end forms an end of the pin, and wherein the soldering portion is elongated and tapered in shape such that the first end has a narrower diameter than that of the second end.

2. The pin of claim 1, further comprising:
   a ring-shaped solder preform which is disposed around the first end of the soldering portion which has the narrower diameter than that of the second end.

3. The pin of claim 1 wherein the engagement portion defines a threaded surface to enable fastening of the circuit board component to the circuit board when the soldering portion is soldered to the via of the circuit board.

4. The pin of claim 3 wherein the engagement portion defines the threaded surface with a stub acme thread.

5. The pin of claim 1 wherein the engagement portion and the soldering portion define a common central axis, and wherein the engagement portion has a length in a direction along the common central axis which is substantially longer than the engagement portion diameter.

6. The pin of claim 1 wherein the engagement portion and the soldering portion define a common central axis, and wherein the engagement portion has a length in a direction along the common central axis which is substantially shorter than the engagement portion diameter.

7. The pin of claim 1, further comprising:
   an intermediate flange portion which is interconnected between the soldering portion and the engagement portion, the intermediate flange portion having an intermediate flange diameter which is substantially wider than the engagement portion diameter and substantially wider than the soldering portion diameter.

8. The pin of claim 7 wherein the intermediate flange portion connects with the soldering portion at an interconnection location, and wherein the intermediate flange portion defines a circular-shaped grooved surface at the interconnection location to ventilate gas from the via of the circuit board when the soldering portion solders to the via of the circuit board.

9. The pin of claim 7 wherein the soldering portion diameter is within a range of substantially 0.030 and 0.050 inches, and wherein the intermediate flange diameter is within a range of substantially 0.150 and 0.300 inches.

10. The pin of claim 7 wherein the ratio of the intermediate flange diameter to the soldering portion diameter is substantially within the range of 8.0-to-1.0 and 5.5-to-1.0.

11. The pin of claim 7 wherein at least part of the intermediate flange portion facing the soldering portion tapers toward the soldering portion.

12. The pin of claim 1 wherein the pin has (i) an overall pin length, and (ii) a maximum diameter which is substantially wider than the overall pin length.

13. The pin of claim 1 wherein the engagement portion and the soldering portion define a common central axis, and wherein the engagement portion is configured to engage with the circuit board component in a direction along the common central axis.

14. The pin of claim 1 wherein the engagement portion diameter is at least twice as large as the soldering portion diameter.

15. The pin of claim 1 wherein the soldering portion diameter is less than 0.050 inches.

16. The pin of claim 15 wherein the ratio of a length of the soldering portion to the soldering portion diameter is within a range of 2.6-to-1 and 4.0-to-1.

17. The pin of claim 15 wherein the ratio of the engagement portion diameter to the soldering portion diameter is substantially 2-to-1.

18. The pin of claim 1, further comprising:
   an intermediate portion disposed between the soldering portion and the engagement portion; the intermediate portion defining a surface configured to solder to the via of the circuit board; the surface of the intermediate portion being tapered, toward the first end of the soldering portion, in a non-perpendicular manner to a central axis of the pin.

19. The pin of claim 18 wherein the intermediate portion further defines a circular-shaped grooved surface adjacent the first end of the soldering portion to facilitate gas ventilation during a soldering process.

20. A connection system, comprising:
   a circuit board which includes a via;
   solder; and
   a pin which includes
      an engagement portion which is configured to engage with a circuit board component, wherein the engagement portion has an engagement portion diameter; and a soldering portion coupled to the engagement portion, wherein the soldering portion has a soldering portion diameter which is substantially narrower than the engagement portion diameter, and wherein the solder forms a solder joint between the soldering portion of the pin and the via of the circuit board, wherein the soldering portion has a first end and a second end, wherein the second end is further from the engagement portion than the first end, wherein the second end forms an end of the pin, and wherein the soldering portion is elongated and tapered in shape such that the first end has a narrower diameter than that of the second end.

21. The connection system of claim 20 wherein the circuit board further includes a pad, wherein the pin further includes an intermediate flange portion which is interconnected between the soldering portion and the engagement portion of the pin, wherein the intermediate flange portion has an intermediate flange diameter which is substantially larger than both the engagement portion diameter and the soldering portion diameter, and wherein at least a portion of the solder is disposed between the intermediate flange portion and the pad.

22. The connection system of claim 20 wherein the pin further includes an intermediate flange portion which is interconnected between the soldering portion and the engagement portion of the pin, wherein the intermediate flange portion has an intermediate flange diameter which is substantially larger than both the engagement portion diameter and the soldering portion diameter, and wherein at least a portion of the intermediate flange portion overlies non-conductive material of the circuit board.

23. The connection system of claim 20, further comprising:
    an anchor which fastens to an end of the soldering portion of the pin that extends from the via of the circuit board on a side of the circuit board which is opposite a side of the circuit board facing the engagement portion of the pin.

24. The connection system of claim 20 wherein the circuit board component is a mechanical circuit board stiffener.

25. The connection system of claim 20 wherein the circuit board component is a mechanical circuit board frame member which distributes force along the circuit board during circuit board installation.

26. The connection system of claim 20 wherein the circuit board component is a circuit board module having operating circuitry which electrically connects to electrical conductors of the circuit board.

27. The connection system of claim 26 wherein the pin connects with an electrical conductor of the circuit board and an electrical conductor of the circuit board module to convey an electrical signal therebetween.

28. The connection system of claim 20 wherein the circuit board component is a heat sink.

29. The connection system of claim 20 wherein the circuit board component is a bed-of-nails test fixture.

30. The connection system of claim 16, further comprising:
    an intermediate portion disposed between the soldering portion and the engagement portion; the intermediate portion defining a surface configured to solder to the via of the circuit board; the surface of the intermediate portion being tapered, toward the first end of the soldering portion, in a non-perpendicular manner to a central axis of the pin.

31. The connection system of claim 30 wherein the intermediate portion further defines a circular-shaped grooved surface adjacent the first end of the soldering portion to facilitate gas ventilation during a soldering process.

32. A method for disposing a circuit board component on a circuit board, the method comprising the steps of:
    obtaining a pin having:
        an engagement portion which is configured to engage with a circuit board component, wherein the engagement portion has an engagement portion diameter; and
        a soldering portion coupled to the engagement portion, wherein the soldering portion is configured to solder to a via of the circuit board, and wherein the soldering portion has a soldering portion diameter which is substantially narrower than the engagement portion diameter;
    soldering the pin to the via of the circuit board; and
    engaging the circuit board component with the engagement portion of the pin to dispose the circuit board component on the circuit board, wherein the soldering portion has a first end and a second end, wherein the second end is further from the engagement portion than the first end, wherein the second end forms an end of the pin, and wherein the soldering portion is elongated and tapered in shape such that the first end has a narrower diameter than that of the second end.

* * * * *